United States Patent [19]

Van Den Bungelaar

[11] Patent Number: 4,945,314

[45] Date of Patent: Jul. 31, 1990

[54] AMPLIFIER ARRANGEMENT WITH SATURATION DETECTION

[75] Inventor: Martinus J. Van Den Bungelaar, Nijmegen, Netherlands

[73] Assignee: U.S. Philips Corporation, New York, N.Y.

[21] Appl. No.: 378,959

[22] Filed: Jul. 12, 1989

[30] Foreign Application Priority Data

Mar. 2, 1989 [NL] Netherlands .......................... 8900507

[51] Int. Cl.$^5$ .......................... H03G 3/30; G01R 21/00
[52] U.S. Cl. .......................................... 330/2; 330/279
[58] Field of Search .................... 330/2, 144, 145, 279, 330/284

[56] References Cited

U.S. PATENT DOCUMENTS

| | | | |
|---|---|---|---|
| 3,852,669 | 12/1974 | Bowman et al. | 330/207 P X |
| 3,891,933 | 6/1975 | Suzuki et al. | 330/2 |
| 3,949,317 | 4/1976 | Crosby | 330/258 |
| 4,048,573 | 9/1977 | Evans et al. | 330/2 |
| 4,318,853 | 3/1982 | Sondermeyer | 330/2 X |
| 4,536,717 | 8/1985 | Hauge et al. | 330/254 |

FOREIGN PATENT DOCUMENTS 108409  6/1984  Japan ........................ 330/2

Primary Examiner—James B. Mullins
Attorney, Agent, or Firm—Edward W. Goodman

[57] ABSTRACT

The invention relates to an amplifier arrangement with load independent saturation detection, including an input stage (7) having a first and a second input terminal (5, 6), an output stage (8) coupled to the input stage (7) and having at least one output transistor (T1, T2), and an output terminal (4) connected to the first input terminal (5) via a coupling network (R1, R2, C). In order to obtain a detection signal when the at least one output transistor (T1, T2) becomes saturated, there is provided a detection device, (16) coupled to the input stage (7) to detect, during operation, an amplitude difference between a signal ($V_i$) to be amplified, which signal is applied to the second input terminal (6), and a portion ($V_t$) of the signal ($V_o$) appearing on the output terminal (4), which portion is applied to the first input terminal (5) via the coupling network (R1, R2, C).

30 Claims, 4 Drawing Sheets

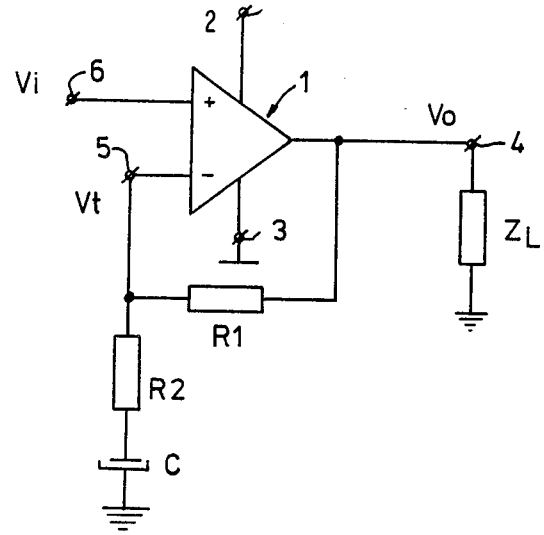
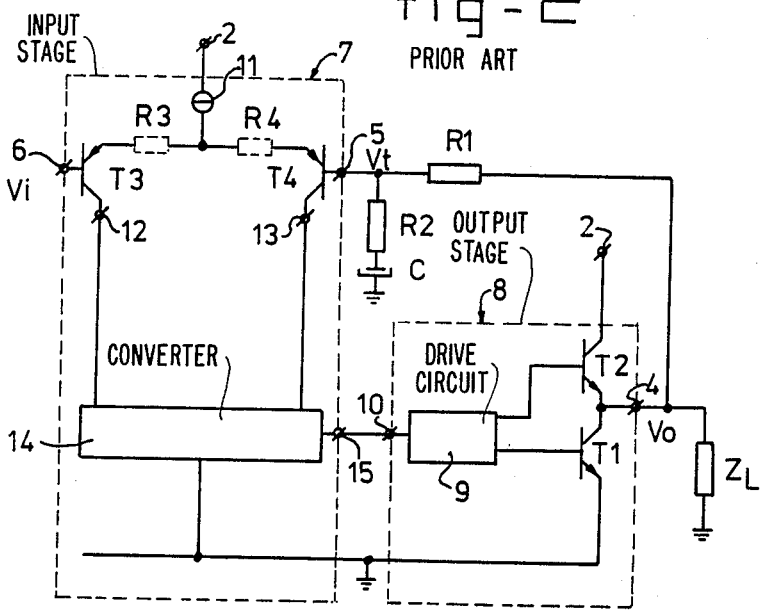

AMPLIFIER ARRANGEMENT WITH SATURATION DETECTION

BACKGROUND OF THE INVENTION

1. Field of the Invention

The invention relates to a detection device for an amplifier arrangement comprising means coupled to the input stage to detect during operation an amplitude difference between a signal to be amplified, which is applied to a second input terminal, and a part of the signal appearing on the output terminal, which part of the signal is applied to a first input terminal via a coupling network.

2. Description of the Related Art

In transistor amplifier arrangements, the maximum amplitude of the amplified signal is, in fact, dictated by the value of the supply voltage to which the amplifier arrangement is connected. When the output transistors of the amplifier arrangement are driven into saturation, the amplitude of the amplified signal is limited to the value of the supply voltage and becomes highly distorted.

In order to preclude this undesired distortion, it is common practice to arrange a resistor in the emitter or collector line of one or more of the output transistors. When the current through the relevant output transistor exceeds a specific limit value, the voltage across this resistor turns on an auxiliary transistor, which drains a part of the drive signal of the relevant output transistor and thereby reduces the drive to this output transistor.

The currents which flow in an output transistor of an amplifier arrangement depend on not only the extent to which this transistor is driven but also on the impedance of the load connected to the arrangement. This means that, if the instant at which the amplified signal is limited by the supply voltage is deleted by measuring the current flowing in one or more output transistors, this detection will be load dependent.

This is a drawback, in particular in audio amplifiers which are generally designed for connection to loudspeakers having different impedance values. Since, as is well known, the impedance of a loudspeaker is frequency dependent, the saturation detection on the basis of the currents in an output transistor will also exhibit an undesirable frequency dependence in amplifiers of this type.

SUMMARY OF THE INVENTION

It is an object of the invention to provide an amplifier arrangement with a load-independent saturation detection. This object achieved in that the detection device comprises means coupled to the input stage to detect during operation an amplitude difference between a signal to be amplified, which signal is applied to the second input terminal and a part of the signal appearing on the output terminal, which part of the signal is applied to the first input terminal via the coupling network.

The invention is based on the idea that in amplifier arrangements of the type defined in the opening paragraph, advantageous use can be made of the fact that the signal amplified by the output stage is fedback to the input stage. By detecting an amplitude difference between the signal to be amplified and the fedback amplified signal, it is possible to detect, independently of the load of the amplifier arrangement, whether the amplified signal limited by the supply voltage when the at least one output transistor becomes saturated.

An embodiment of the amplifier arrangement in accordance with the invention is characterized in that the input stage comprises a differential pair having an inverting first and a non-invering second input terminal and having a first and a second output terminal, the detection device comprising a comparator coupled to the first and the second output terminal of the differential pair and having an output terminal for supplying the detection signal.

As long as the output voltage of the amplifier arrangement is not limited by the supply voltage, the signal to be amplifed, which is applied to the non-inverting second input terminal, and the amplified signal, which is fed back to the inverting first input terminal, are equal to one another if the differential pair is symmetrical, so that consequently the signals on the output terminals of the differential pair, which are applied to the comparator, are equal to each other. The comparator may be constructed, for example, in such a way that it does not produce a detection signal on its output terminal in this situation.

However, when the amplified signal is limited by the supply voltage, the fed back signal will deviate significantly from the signal to be amplified with respect to its waveform and amplitude, which results in an amplitude difference between the respective output signals of the differential pair. This amplitude difference is detected by the comparator and results in a detection signal on its output terminal.

In a further embodiment of the amplifier arrangement in accordance with the invention, depending on the signal to be amplified, which is applied to the non-inverting terminal, and the amplified signal, which is fed back to the inverting input terminal, the ratio between the signals on the outputs of the differential pair is laid down simply in that a first and a second resistor are respectively arranged in series with the respective emitters of the transistors of the differential pair.

A further embodiment of the amplifier arrangement in accordance with the invention is characterized in that the differential pair is loaded by a current-mirror circuit, having an input and an output terminals connected to the first and the second output terminal of the differential pair, the comparator comprising a transistor of a conductivity type opposite to that of the transistors of the differential pair, the base emitter path of said transistor being connected between the input terminal and the output terminal of the current mirror circuit and the collector of said transistor constituting the output terminal of the comparator.

The current mirror cirucit functions as a push-pull to single-ended converter to provide the input signal for the output stage of the amplifer arrangement. By means of this single-transistor comparator, it is possible to detect whether the amplified output signal is limited relative to one or the other polarity of the supply voltage. This depends on the respective connections of its base and emitter to the input and the output terminals of the current mirror circuit.

In the situation that the signal amplifed by the output stage is limited relative to the relevant polarity of the supply voltage, its portion which is fed back to the inverting first input terminal of the differential pair will no longeer change, whereas the signal to be amplifed and applied to the non-inverting second input terminal still changes. This results in such an asymmetrical current distribution in the differential pair that the signal currents applied to the input and the output terminals of the current mirror circuit via the first and the second ouput terminals of said differential pair will differ from one another.

If the collector of said one transistor is suitably connected to a power-supply terminal of the amplifier arrangement, this transistor will supply the relevant signal current difference owing to the action of the current-mirror circuit, said difference being a measure of the degree of overdriving of the at least one output transistor and being loaded independent. This embodiment of the amplifer arrangement in accordance with the invention has the advantage of a comparatively simple detection device which essentially comprises one transistor.

If it is required to detect a limitation of the amplified output signal both relative to one polarity and relative to the other polarity of the supply voltage, this can be achieved in accordance with yet another embodiment of the amplifer arrangement in accordance with the invention in that the comparator comprises a further transistor of the same conductivity type as said one transistor, said further transistor having its base-emitter path arranged between the input terminal and the output terminal of the current-mirror circuit, oppositely to the base-emitter path of said one transistor, and its collector connected to the collector of said one transistor.

Said one transistor then provides the difference between the output currents of the differential pair if the amplified output signal is limited relative to one polarity of the supply voltage and the further transistor provides the difference current in the case of limitation relative to the other polarity of the supply voltage.

In amplifier arrangements for, for example, audio purposes, the output signal is generally allowed to exhibit a specific degree of distortion. In particular for signals having a comparatively large dynamic range it is generally undesirable that brief overload peaks which saturate said at least one output transistor give rise to a detection signal.

In accordance with still another embodiment of the invention, this can be achieved in that a threshold circuit is connected to the output terminal of the comparator, the threshold circuit having an output terminal for supplying the detection signal above a specific threshold value when the at least one output transistor becomes saturated.

An embodiment of the amplifer arrangement in accordance with the invention which comprises a threshold circuit and which is suitable for integration is characterized in that the threshold circuit comprises a current reference element and a first and second current mirror circuit of opposite conductivity types, the input terminal of the first current mirror circuit together with the output terminal of the current reference element being connected to the output terminal of the comparator, and the output terminal of the first current-mirror circuit being connected to the input terminal of the second current mirror circuit, whose output terminal constitutes the output terminal for supplying the detection signal.

The strength of the reference current supplied by the current-reference element mainly determines the degree of overdriving of the at least one output transistor for which a detection signal is supplied.

Yet a further embodiment of the amplifier arrangement in accordance with the invention is characterized in that the current reference element is adapted to supply an adjustable reference current. This results in an amplifer arrangement whose maximum permissible distortion can be laid down simply.

An embodiment of the amplifier arrangement in accordance with the invention featuring an output-swing limitation, i.e. in which the detection signal, produced when said at least one output transistor is saturated, is employed to reduce the drive, is characterized in that it further comprises a control device which is responsive to the detection signal to influence the amplitude of the signal to be amplified, said control having an input terminal for receiving the signal to be amplified, an output terminal connected to the second input terminal of the input stage, and a control terminal connected to the output terminal of the comparator to receive the detection signal.

In contradistinction to the prior-art arrangement in which the drive of the output transistor is influenced directly, which in practice leads to the amplified signal being distorted, this embodiment of the amplifier arrangement in accordance with the invention influences the signal to be amplifed, which is applied to the input stage. For this purpose the control device can be optimized in such a way that the signal to be amplifed is not distorted, or is not significantly distorted, when it is attenuated.

In order to prevent the control device from being responsive to brief overdrive situations, an embodiment of the amplifier arrangement in accordance with the invention comprising output swing limitation is characterized in that the output terminal of the comparator is connected to said control terminal by means of a filter circuit.

BRIEF DESCRIPTION OF THE DRAWINGS

The invention will now be described in more detail, by way of example, with reference to the accompanying drawings. In the drawings:

FIG. 1 is a general circuit diagram of a feedback amplifier arrangement without saturation detection;

FIG. 2 is a circuit diagram of the amplifier arrangement shown in FIG. 1, comprising an output stage and an input stage in the form of a differential pair;

DESCRIPTION OF THE PREFERRED EMBODIMENT

Figure 3:
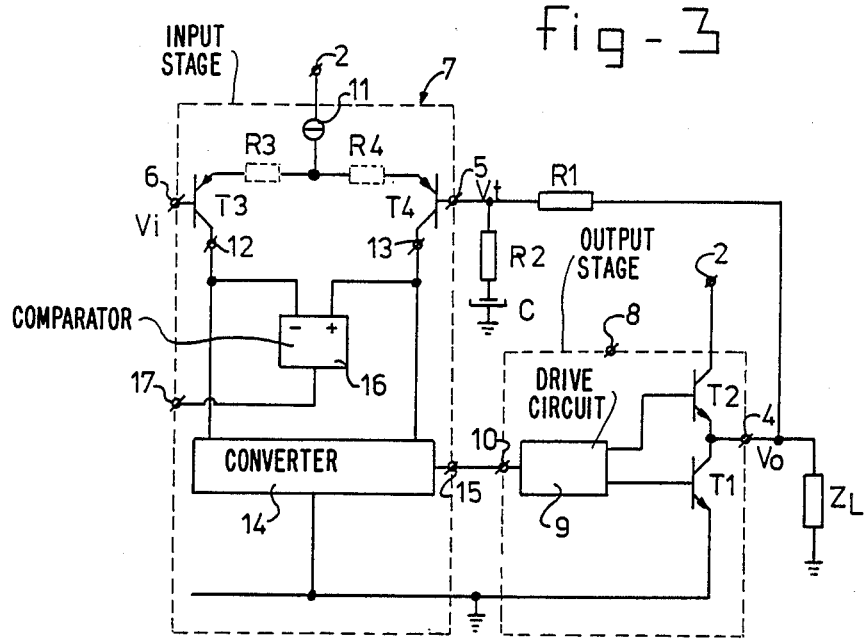
FIG. 3 shows an embodiment of the arrangement in accordance with the invention comprising a comparator connected to the input stage shown in FIG. 2.

FIG. 1 is a general circuit diagram of a feedback amplifier arrangement. The amplifier arrangement 1 has a first supply terminal 2 for a positive supply voltage $+V$ and a second supply terminal 3 for a negative supply voltage, in the present case ground potential. A load impedance $Z_L$, for example a loudspeaker, is connected between the output terminal 4 of the amplifier arrangement 1 and ground.

The amplifier arrangement 1 further comprises an inverting first input terminal 5, to which a feedback network is connected, which in the present case comprises a resistor R1 connected to the output terminal 4, and a series arrangement which comprises a resistor R2 and a capacitor C1 and which is connected to ground. The signal $V_i$ to be amplified is applied to the non-inverting second input terminal 6 of the amplifer arrangement 1, resulting in an amplified signal $V_o$ on the output terminal 4 of the amplifier arrangement, and a feedback signal $V_t$ is applied to the first input terminal 5.

The amplifier arrangement 1 may be of any type known per se, but it is to be noted that when an inverting feedback network is used, the first input terminal 5 need not necessarily be an inverting terminal.

FIG. 2 shows the amplifier arrangement shown in FIG. 1, comprising a input stage 7, shown in a frame, to which a output stage 8, also shown in a frame and comprising two NPN output transistors T1 and T2, is connected, the collector-emitter paths of said output transistors being connected in series between the first supply terminal 2 and ground. The collector of the transistor T1 and the emitter transistor T2 are interconnected and constitute the output terminal 4 for the connection of the load impedance $Z_L$. The bases of the output transistors T1 and T2 are driven in phase opposition by a drive circuit 9, having an input terminal 10 to which the signal to be amplifed can be applied from the input stage 7.

The input stage 7 comprises a differential pair of PNP transistors T3 and T4 whose common-emitter terminal is connected to the first supply terminal 2 via a current source circuit 11. The base of the transistor T3 constitutes the non-inverting input terminal 6 and the base of the transistor T4 constitutes the inverting input terminal 5, to which the feedback network R1, R2, C1 is connected in the same way as in FIG. 1.

The collectors of the transistors T3, T4 constitute a first output terminal 12 and a second output terminal 13, respectively, of the differential pair, these output terminals being both connected to the inputs of a push-pull to single-ended converter 14. The output terminal 15 of the converter 14 is connected to the input terminal 10 of the drive circuit 9.

Such an amplifer arrangement 1 comprising an input stage 7 and an output stage 8 is employed, for example, in the Philips ICs TDA 1514 and TDA 1516. It is obvious that instead of the push-pull output stage comprising the output transistors T1, T2, it is also possible to utilise a simple class A amplifier stage comprising one output transistor.

In the case of adequate negative feedback in the input stage 7, which can be adjusted by means of the resistors R3 and R4 shown in broken lines, the input signal $V_i$ in the non-saturated state of the output transistors T1, T2 is substantially equal to the fedback signal $V_t$. In the case of a suitable symmetrical construction of the differential pair T3, T4, the sum of the signals to be processed and appearing on the output terminals 12, 13 thereof is then substantially zero.

However, when the ouput signal $V_o$ is limited relative to the supply voltage, the fedback signal $V_t$ will not increase any further, which, in the case of an increase of the signal $V_i$ to be amplified, results in unequal output voltages on the output terminals 12, 13 of the differential pair. Therefore, the invention provides means for detecting such a difference between the output signals of the differential pair T3, T4 in the input stage 7 of the amplifier arrangement.

In an embodiment of the invention, as shown in FIG. 3, a comparator 16 is used for this purpose, the comparator 16 having an inverting (−) and a non-inverting (+) input terminal connected to the output terminals 12 and 13 of the differential pair. The signal on the output terminal 17 of this comparator 16 is now a measure of the degree of saturation of the output transistors T1, T2.

Figure 4:
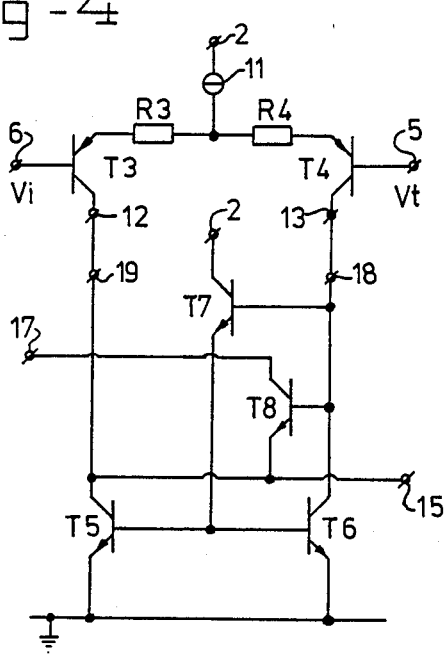
FIGS. 4, 5 and 6 are circuit diagrams of the input stage of the amplifier arrangement in accordance with the invention.

FIG. 4 shows the input stage of a preferred embodiment of the amplifier arrangement in accordance with the invention, in which the push-pull to single-ended converter 14 comprises a current-mirror circuit having the transistors T5, T6 and T7. The current mirror circuit comprises transistors of a conductivity type opposite to that of the transistors T3, T4 of the differential pair. The emitters of the transistors T5, T6 are connected to ground and their interconnected bases are connected to the emitter of the transistor T7, which has its base connected to the collector of the transistor T6 to form the input terminal 18 of the current mirror circuit. The collector of the transistor T7 is connected to the first supply terminal 2. The collector of the transistor T5 constitutes the output terminal 19 of the current mirror circuit for connection to the input terminal 10 of the drive circuit 9 in the output stage 8. The operation of said push-pull-to single-ended converter is known per se and requires no further explanation.

In the preferred embodiment of the amplifier arrangement in accordance with the invention shown in FIG. 4, the detection device comprises a further transistor T8 of a conductivity type opposite to that of the transistors T3, T4. The base of the transistor T8 is connected to the input terminal 18 and the emitter is connected to the output terminal 19 of the current-mirror circuit, the terminal 19 also constituting the output terminal 15 of the converter. The collector of the transistor T8 now constitutes the output terminal 17 for supplying the detection signal.

The arrangement operates as follows. When the output transistor T2 becomes saturated, the fedback output signal $V_t$ will assume a fixed value. An increase of the input signal $V_i$ results in the transistor T4 of the differential pair being driven further into conduction than the transistor T3. The collector current of the transistor T4 is reproduced in the collector of the transistor T5 via the current mirror circuit T6, T7 and T5. This means that the current in the transistor T5 is larger than that in the transistor T3 of the differential pair which is coupled thereto, so that the voltage on the output terminal 19 decreses and the transistor T5 is saturated. As a result of this, the transistor T8 becomes conductive and carries a current $I_D$, assuming that the output terminal 17 is connected to the first supply terminal 2 via a resistor (not shown). This current $I_D$ is now a measure of the degree of overdriving of the output transistors and is approximately equal to $(V_i - V_t)/(R3 + R4)$. This current $I_D$, like the output signal of the comparator 16 in FIG. 3, is independent of the load impedance $Z_L$ at the output terminal 4 of the amplifier arrangement.

If saturation of the output transistor T1 is to be detected, the connections of the base and emitter of the transistor T8 should be interchanged (not shown). Indeed, when the output transistor T1 is saturated, the output signal $V_o$ and hence the fedback signal $V_t$ cannot decrease any further when the output signal $V_i$ decreases. As a result of this, the transistor T3 of the differential pair will become more conductive than the transistor T4 of this pair. As a consequence, the voltage on the collector of the transistor T5 increases relative to the voltage on the collector of the transistor T6, so that the transistor T8 is turned on again and supplies a detection signal in the form of its collector current.

Figure 5:
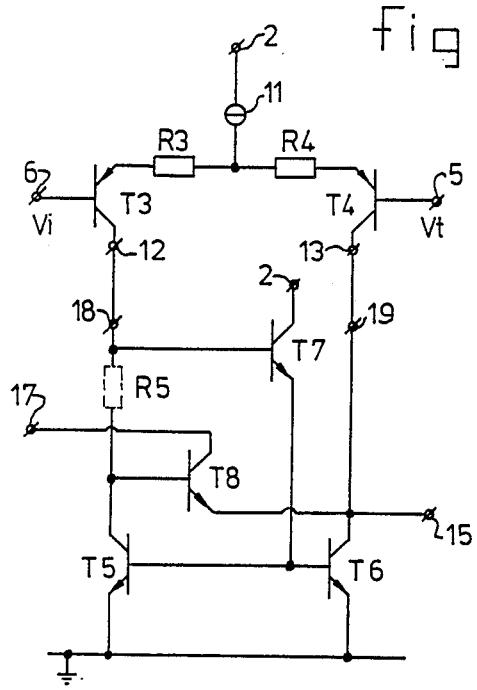

FIG. 5 shows a circuit similar to that shown in FIG. 4, but in comparison with the latter circuit, the connections between the first and the second output terminal 12, 13 of the differential pair and the input and output terminals 18, 19 of the current mirror circuit have been interchanged. By means of this circuit, it is detected whether the output transistor T1 becomes saturated. Again it is also possible to interchange the base and emitter connections of the transistor T8 in order to detect saturation of the output transistor T2.

It is to be noted that interchanging the connections of the current-mirror circuit and of the differential pair, in comparison with the arrangement shown in FIG. 4, results in an inverted signal appearing on the output terminal 15. A suitable drive of the two output transistors can then be achieved, for example, by the use of the drive circuit 9.

In order to prevent the voltage on the base of the transistor T7 of the current mirror circuit from excessively decreasing when the transistor T8 is turned on, a resistor R5 can be arranged between the bases of the transistors T7 and T8, for example as is indicated in broken lines in FIG. 5.

Figure 6:
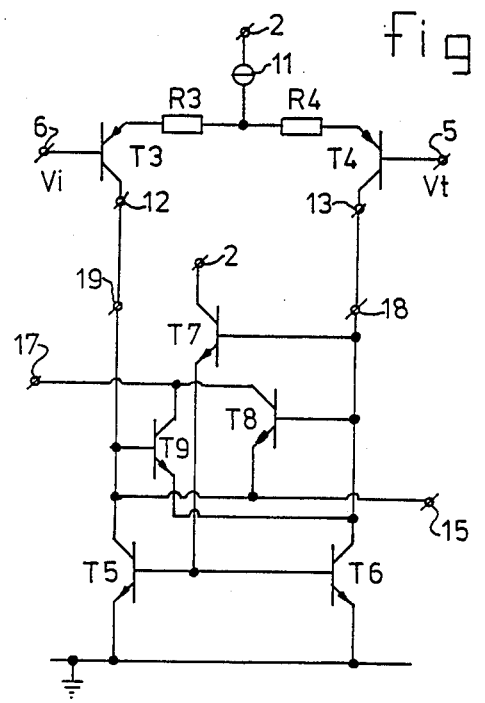

A further embodiment of the arrangement shown in FIG. 4, which enables limitation of the amplified output signal relative to either polarity of the supply voltage to be detected, is shown in FIG. 6. The further transistor T9 may carry a collector current when the output transistor T1 is saturated, while the transistor T8, as described, can be turned on when the output transistor T2 is saturated. This arrangement may also comprise one or two resistors R5, similarly to the arrangement shown in FIG. 5.

Generally, a certain degree of overdriving is permissible in audio amplifiers. In that case the detection device should not immediately supply a detection signal at the instant at which the output transistors T1, T2 become saturated.

Figure 7:
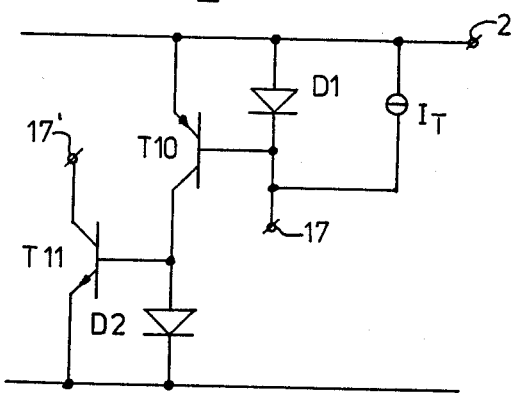
FIG. 7 shows the circuit diagram of a threshold circuit used in the arrangement in accordance with the invention.

For this purpose as shown in FIG. 7, a threshold circuit is connected to the output terminal 17 of the comparator and comprises a PNP transistor T10, an NPN transistor T11, two voltage reference elements D1, D2, and a current reference element $I_t$.

As is shown in FIG. 7, a parallel arrangement comprising the base emitter junction of the transistor T10, the voltage reference element D1 and the current-reference element $I_T$ is connected between the output terminal 17 of the comparator and the first power supply terminal 2 of the amplifier arrangement.

In fact, the transistor T10 and the voltage reference element D1 constitute a first current mirror circuit whose input terminal is connected to the output terminal 17 of the comparator. A parallel arrangement, comprising the base-emitter junction of the transistor T11 and the voltage reference element D2, is connected to the collector of the transistor T10, i.e. the output terminal of the first current mirror circuit. The transistor T11 and the voltage reference element D2 in fact constitute a second current mirror circuit, whose input terminal is connected to the output terminal of the first current mirror circuit. The collector of the transistor T11, i.e. the output terminal of the second current mirror circuit, now constitutes the ouput terminal 17′ for supplying the detection signal.

In FIG. 5 the voltage reference elements D1, D2 are shown as semiconductor diodes, but obviously they may be formed by diode-connected transistors or other semiconductor junctions. The current reference element $I_T$ can be realized in any manner known per se and is preferably adjustable. It will be appreciated that other types of current mirror circuits, which are generally known per se, may be employed. The operation of the threshold circuit can be explained as follows.

As long as the current to be supplied the transistor TR8 when one or both output transistors T1, T2 become(s) saturated is smaller than the current which can be supplied by the current reference element $I_T$, the first current mirror circuit and hence the second current mirror circuit will remain currentles. Only when one of the currents to be delivered by the transistor T8 is larger than that which can be supplied by the current reference element $I_T$, will current be withdrawn from the power supply terminal 2 of the circuit arrangement via the voltage reference element D1. This current is reproduced in the transistor T10 and, via the voltage reference element D2, in the collector line of the transistor T11 or the output terminal 17′ of the threshold circuit.

By making the current-reference element $I_T$ adjustable, it is simple to define for which degree of overdriving of the output transistors T1, T2 a detection signal will appear on the output terminal 17′ of the threshold circuit.

Figure 8:
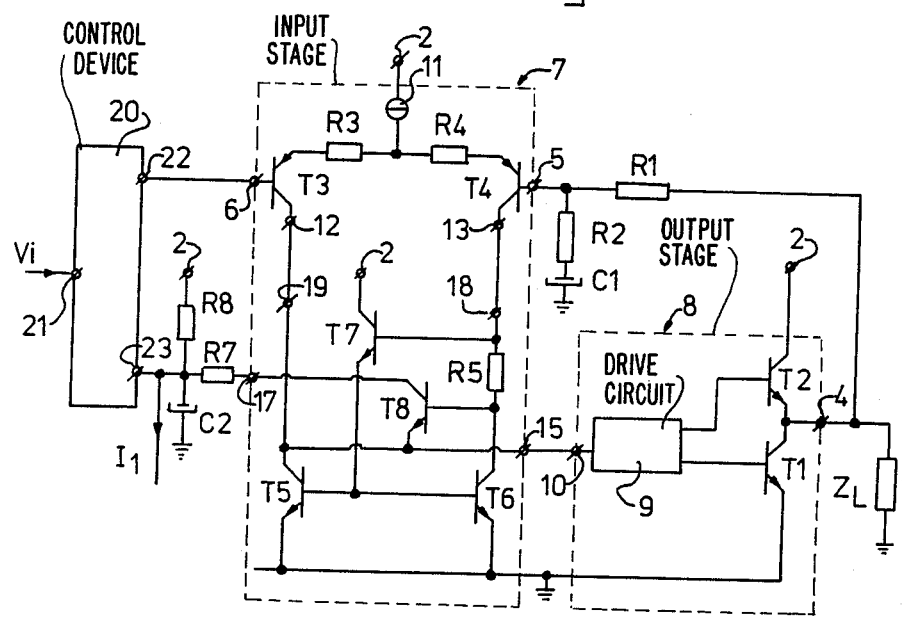
FIG. 8 shows a circuit diagram of an embodiment of the amplifier arrangement in accordance with the invention, featuring output-swing limitation.

As is shown in FIG. 8, the detection signal can be advantageously applied to a control device 20 having an input terminal 21 for receiving the signal $V_i$ to be amplified, an output terminal 22 on which the signal to be amplified, which has been influenced by the control device 20, is available and which is connected to the second input terminal 6 of the amplifier arrangement, and a control input terminal 23 for receiving the detection signal, in dependence upon which signal to be amplified is, for example, attenuated by the control device 20.

Such a control device 20 may be constructed, for example, as an electrical volume control or a processing unit for digitally influencing the signal to be amplified. Such a volume control is employed in, for example, the I.C. Phillips TDA 1074A. A digital processing unit is available, for example, as the I.C. Philips TDA 8420.

When an output transistor becomes saturated, the setting of the control device 20, as dictated for example by the external control signal $I_1$ applied to the control terminal 23, is influenced by the detection signal on the output terminal 17 or 17′. This causes the setting of the control device 20 to change and the signal applied to the second input terminal 6 of the amplifier arrangement to be attenuated. This reduces the drive to the output transistors T1, T2, so that these transistors come out of saturation. In this way limitation of the output signal of the amplifier arrangement relative to the supply voltage is limited, without distortion of the drive signal of one of the output transistors being introduced.

If necessary, the detection signal may be applied to the control terminal 23 of the control device 20 by means of a filter circuit, for example in the form of an integrator circuit R7, R8, C2 in order to obtain the desired control characteristic. By a suitable choice of the resistors R7 and R8 and the value of the capacitor C2, it is possible to prevent the control signal from being changed in the case of a comparatively brief overdrive of the output transistor T1 and T2.

It will be obvious to those skilled in the art that the transistor in the arrangements described above may be interchanged as far as their conductivity types are concerned. For the current mirror circuit in the input stage, any suitable circuit may be utilized. Moreover, the transistors T3 and T4 of the differential pair may each be replaced by, for example, a Darlington pair.

I claim:

1. An amplifier arrangement with saturation detection comprising an input stage having an inverting first input terminal and a non-inverting second input terminal, an output stage coupled to said input stage and comprising at least one output transistor and an output terminal connected to the first input terminal via a coupling network, and a detection device for supplying a detection signal when said at least one output transistor is saturated, said detection device comprising means coupled to the input stage for detecting, during operation, an amplitude difference between a signal to be amplified, which is applied to the second input terminal, and a part of the signal appearing on the output terminal, said part of the output signal being applied to the first input terminal via the coupling network, wherein said input stage comprises a differential pair of transistors having emitters interconnected and connected to a first power supply terminal, bases constituting said inverting first input terminal and said non-inverting second input terminal, respectively, of said input circuit, and collectors constituting a first output terminal and a second output terminal, respectively, and said detection device comprises a comparator coupled to the first and the second output terminals of the differential pair and having an output terminal for supplying the detection signal, characterized in that the differential pair is loaded by a current mirror circuit, having an input terminal and an output terminal connected to the first and the second output terminals of the differential pair, the comparator comprising a transistor of a conductivity type opposite to that of the transistors of the differential pair, the base-emitter path of said comparator transistor being connected between the input terminal and the output terminal of the current mirror circuit and the collector of said comparator transistor constituting the output terminal of the comparator.

2. An amplifier arrangement as claimed in claim 1, characterized in that the comparator comprises a further transistor of the same conductivity type as said comparator transistor, said further transistor having a base-emitter path connected between the input terminal and the output terminal of the current mirror circuit, oppositely to the base-emitter path of said comparator transistor, and a collector connected to the collector of said comparator transistor.

3. An amplifier arrangement as claimed in claim 1 or 2, characterized in that a threshold circuit is connected to the output terminal of the comparator, said threshold circuit having an output terminal for supplying the detection signal above a specific threshold level when the at least one output transistor becomes saturated.

4. An amplifier arrangement as claimed in claim 3, characterized in that the threshold circuit comprises a current reference element and a first current mirror circuit and a second current mirror circuit of opposite conductivity types, an input terminal of the first current mirror circuit together with an output terminal of the current reference element being connected to the output terminal of the comparator, and an output terminal of the first current mirror circuit being connected to an input terminal of the second current mirror circuit, an output terminal of the second current mirror circuit constituting the output terminal for supplying the detection signal.

5. An amplifier arrangement as claimed in claim 4, characterized in that the current reference element supplies an adjustable reference current.

6. An amplifier arrangement as claimed in claim 1, characterized in that a first resistor and a second resistor are respectively arranged in series with the respective emitters of the transistors of the differential pair.

7. An amplifier arrangement as claimed in claim 6, characterized in that the comparator comprises a further transistor of the same conductivity type as said comparator transistor, said further transistor having a base-emitter path connected between the input terminal and the output terminal of the current-mirror circuit, oppositely to the base-emitter path of said comparator transistor, and a collector connected to the collector of said comparator transistor.

8. An amplifier arrangement as claimed in claim 6 or 5, characterized in that a threshold circuit is connected to the output terminal of the comparator, said threshold circuit having an output terminal for supplying the detection signal above a specific threshold value when the at least one output transistor becomes saturated.

9. An amplifier arrangement as claimed in claim 8, characterized in that the threshold circuit comprises a current reference element and a first and a second current mirror circuit of opposite conductivity types, an input terminal of the first current mirror circuit together with an output terminal of the current reference element being connected to the output terminal of the comparator, and an output terminal of the first current mirror circuit being connected to an input terminal of the second current mirror circuit, an output terminal of the second current mirror circuit constituting the output terminal for supplying the detection signal.

10. An amplifier arrangement as claimed in claim 9, characterized in that the current reference element supplies an adjustable reference current.

11. An amplifier arrangement as claimed in claim 1, characterized in that said amplifier arrangement further comprises a control device which is responsive to the detection signal to influence the amplitude of the signal to be amplified, said control device having an input terminal for receiving the signal to be amplified, an output terminal connected to the second input terminal of the input stage, and a control terminal connected to the output terminal of the comparator to receive the detection signal.

12. An amplifier arrangement as claimed in claim 11, characterized in that the output terminal of the comparator is connected to said control terminal by means of a filter circuit.

13. An amplifier arrangement as claimed in claim 12, characterized in that the filter circuit comprises a series arrangement of a resistor and a capacitor connected between the output terminal of the comparator and a second power supply terminal, a node between said resistor and said capacitor being connected to the control terminal and by a further resistor to the first power supply terminal.

14. An amplifier arrangment with saturation detection, comprising an input stage comprising a differential pair having a first input terminal and a second input terminal and a first output terminal and a second output terminal, an output stage coupled to said input stage and comprising at least one output transistor and having an output terminal coupled to the first input terminal via a coupling network, and a detection device having an output terminal for supplying a detection signal when said at least one output transistor is saturated, the detection device comprising a comparator having a first input terminal and a second input terminal respectively connected to the first output terminal and the second output terminal of the differential pair and having an output terminal coupled to the output terminal of the detection device, characterized in that the comparator comprises a transistor having a base-emitter path connected between the first input terminal and the second input terminal of the comparator and having a collector connected to the output terminal of the comparator.

15. An amplifier arrangement as claimed in claim 14, characterized in that the comparator comprises a further transistor of the same conductivity type as said comparator transistor, said further transistor having a base-emitter path connected between the first output terminal and the second output terminal of the comparator, oppositely to the base-emitter path of said comparator transistor, and having a collector connected to the collector of said comparator transistor.

16. An amplifier arrangement as claimed in claim 14 or 15, characterized in that the output terminal of the comparator is coupled to the output terminal of the detection device via a threshold circuit, the threshold circuit supplying the detection signal when the at least one output transistor is saturated above a specific threshold value.

17. An amplifier arrangement as claimed in claim 16, characterized in that the threshold circuit comprises a current reference element and a first current mirror circuit and a second current mirror circuit of opposite conductivity types, an input terminal of the first current mirror circuit together with an output terminal of the current reference element being connected to the output terminal of the comparator, and an output terminal of the first current mirror circuit being connected to an input terminal of the second current mirror circuit, an output terminal of the second current mirror circuit being coupled to the output terminal of the detection device.

18. An amplifier arrangement as claimed in claim 17, characterized in that the current reference element supplies an adjustable reference current.

19. An amplifier arrangement as claimed in claim 18, characterized in that the amplifier arrangement further comprises a control device responsive to the detection signal to influence a signal to be amplified, the control device having an input terminal for receiving the signal to be amplified, an output terminal connected to the second input terminal of the differential pair, and a control terminal connected to the output terminal of the detection device to receive the detection signal.

20. An amplifier arrangement as claimed in claim 19, characterized in that the output terminal of the detection device is coupled to said control terminal by means of a filter circuit.

21. An amplifier arrangement as claimed in claim 20, characterized in that the filter circuit comprises a series arrangement of a resistor and a capacitor connected between the output terminal of the detection device and a first power supply terminal, a node between said resistor and said capacitor being connected to the control terminal and by means of a further resistor to a second power supply terminal.

22. An amplifier arrangement as claimed in claim 17, characterized in that the amplifier arrangement further comprises a control device responsive to the detection signal to influence a signal to be amplified, the control device having an input terminal for receiving the signal to be amplified, an output terminal connected to the second input terminal of the differential pair, and a control terminal connected to the output terminal of the detection device to receive the detection signal.

23. An amplifier arrangement as claimed in claim 22, characterized in that the output terminal of the detection device is coupled to said control terminal by means of a filter circuit.

24. An amplifier arrangement as claimed in claim 23, characterized in that the filter circuit comprises a series arrangement of a resistor and a capacitor connected between the output terminal of the detection device and a first power supply terminal, a node between said resistor and said capacitor being connected to the control terminal and by means of a further resistor to a second power supply terminal.

25. An amplifier arrangement as claimed in claim 16, characterized in that the simplifier arrangement further comprises a control device responsive to the detection signal to influence a signal to be amplified, the control device having an input terminal for receiving the signal to be amplified, an output terminal connnected to the second input terminal of the differential pair, and a control terminal connected to the output terminal of the detection device to receive the detection signal.

26. An amplifier arrangement as claimed in claim 25, characterized in that the output terminal of the detection device is coupled to said control terminal by mean of a filter circuit.

27. An amplifier arrangement as claimed in claim 26, characterized in that the filter circuit comprises a series arrangement of a resistor and a capacitor connected between the output terminal of the detection device and a first power supply terminal, a node between said resistor and said capacitor being connected to the control terminal and by means of a further resistor to a second power supply terminal.

28. An amplifier arrangement as claimed in claim 14, or 15, characterized in that the amplifier arrangement further comprises a control device responsive to the detection signal to influence a signal to be amplified, the control device having an input terminal for receiving the signal to be amplified, an output terminal connectred to the second input terminal of the differential pair, and a control terminal connected to the output terminal of the detection device to receive the detection signal.

29. An amplifier arrangement as claimed in claim 28, characterized in that the output terminal of the detection device is coupled to said control terminal by means of a filter circuit.

30. An amplifier arrangement as claimed in claim 29, characterized in that the filter circuit comprises a series arrangement of a resistor and a capacitor connected between the output terminal of the detection device and a first power supply terminal, a node between said resistor and said capacitor being connected to the control terminal and by means of a further resistor to a second power supply terminal.

* * * * *